(12) United States Patent
Kang et al.

(10) Patent No.: US 9,560,783 B2
(45) Date of Patent: Jan. 31, 2017

(54) ELECTRONIC DEVICE AND PROTECTIVE COVER THEREFOR

(71) Applicant: Samsung Electronics Co., Ltd., Suwon-si, Gyeonggi-do (KR)

(72) Inventors: Tae-Seuk Kang, Suwon-si (KR); Hyo-Geun Ahn, Yongin-si (KR); Sang-Won Lee, Seoul (KR); Jong-Chul Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 64 days.

(21) Appl. No.: 14/622,090

(22) Filed: Feb. 13, 2015

(65) Prior Publication Data
US 2015/0245522 A1    Aug. 27, 2015

(30) Foreign Application Priority Data
Feb. 21, 2014 (KR) .................. 10-2014-0020939

(51) Int. Cl.
| | |
|---|---|
| *H05K 9/00* | (2006.01) |
| *H05K 5/06* | (2006.01) |
| *G06F 1/16* | (2006.01) |
| *H04M 1/02* | (2006.01) |
| *H04M 1/18* | (2006.01) |
| *A45C 11/00* | (2006.01) |
| *H05K 5/00* | (2006.01) |
| *H05K 5/02* | (2006.01) |
| *H05K 5/03* | (2006.01) |
| *H04M 1/725* | (2006.01) |

(52) U.S. Cl.
CPC ............ *H05K 5/061* (2013.01); *A45C 11/00* (2013.01); *G06F 1/1635* (2013.01); *G06F 1/1656* (2013.01); *H04M 1/0252* (2013.01); *H04M 1/18* (2013.01); *H05K 5/0013* (2013.01); *H05K 5/0086* (2013.01); *H05K 5/0247* (2013.01); *H05K 5/03* (2013.01); *H04M 1/0262* (2013.01); *H04M 1/72575* (2013.01); *H04M 2250/04* (2013.01)

(58) Field of Classification Search
USPC ................ 361/728–730, 732, 752, 796, 800, 816,361/818, 799
See application file for complete search history.

(56) References Cited

U.S. PATENT DOCUMENTS

| | | | | |
|---|---|---|---|---|
| 7,923,647 B2* | 4/2011 | Murakami | .......... | B29C 65/1635 174/560 |
| 8,068,331 B2* | 11/2011 | Sauers | .................. | G06F 1/1626 206/305 |

(Continued)

FOREIGN PATENT DOCUMENTS

| | | | |
|---|---|---|---|
| EP | 2 648 274 A1 | 10/2013 | |
| JP | 2012-146715 A * | 8/2012 | ............... H05K 5/06 |

(Continued)

*Primary Examiner* — Hung S Bui
(74) *Attorney, Agent, or Firm* — Jefferson IP Law, LLP

(57) ABSTRACT

An electronic device is provided. The electronic device includes a body configured to house the electronic device and including a space for accommodating a battery on one surface of the body and a cover configured to cover at least the space and being detachably attached to the body. The cover includes a first sealing member located between the one surface of the body and an inner surface of the cover and formed to surround the space.

26 Claims, 8 Drawing Sheets

(56) References Cited

U.S. PATENT DOCUMENTS

| | | | |
|---|---|---|---|
| 2011/0209890 A1* | 9/2011 | Yamaguchi | H05K 5/069 |
| | | | 174/50.5 |
| 2011/0278301 A1* | 11/2011 | Sasamori | H04M 1/0262 |
| | | | 220/378 |
| 2011/0293981 A1 | 12/2011 | Fang et al. | |
| 2012/0162881 A1* | 6/2012 | Usui | H04M 1/0262 |
| | | | 361/679.01 |
| 2013/0193006 A1 | 8/2013 | Bergreen et al. | |
| 2013/0217451 A1 | 8/2013 | Komiyama et al. | |
| 2013/0252061 A1 | 9/2013 | Kim et al. | |
| 2013/0265715 A1* | 10/2013 | Bae | H04M 1/18 |
| | | | 361/679.55 |

FOREIGN PATENT DOCUMENTS

| | | |
|---|---|---|
| WO | 00/56040 A1 | 9/2000 |
| WO | 2013/080669 A1 | 6/2013 |

* cited by examiner

ELECTRONIC DEVICE AND PROTECTIVE COVER THEREFOR

CROSS-REFERENCE TO RELATED APPLICATION

This application claims the benefit under 35 U.S.C. §119 (a) of a Korean patent application filed on Feb. 21, 2014 in the Korean Intellectual Property Office and assigned Serial number 10-2014-0020939, the entire disclosure of which is hereby incorporated by reference.

TECHNICAL FIELD

The present disclosure relates to an electronic device and a protective cover therefor.

BACKGROUND

In recent years, various electronic devices are provided to users, and portable terminals, such as a mobile phone, an Motion Picture Expert Group (MPEG) audio layer 3 (MP3) player, a Portable Media Player (PMP), and an electronic book, by which a user can access various contents while carrying the electronic device are widely used. Various functions, such as an ability to shoot photos or record moving images, play music, videos, and multimedia, and execute game functions, as well as a wireless transmission/reception function, are being integrated into the portable terminals. A display unit is provided on a front surface of the portable terminal, such that the multiple functions can be used, and a recent portable terminal, such as a smart phone, is provided with a display unit through which an entire front surface of the terminal is sensitive to a touch.

The electronic device, such as a portable terminal, is provided with various cases, or protective covers, which may be generally referred to as a cover. For example, a battery cover for covering a battery may be provided on a rear surface of the electronic device. The battery cover may be variously classified according to a mounting location or a cover state of the electronic device. For example, the battery cover may include a form which can be provided only on a rear surface of the electronic device, in detail, a form in which a display is exposed and only a periphery of an external appearance of the electronic device or a rear case is covered such that the display unit is used, or a form in which the entire electronic device is covered through a flip type case and the display unit is covered such that the display unit is used.

The above information is presented as background information only to assist with an understanding of the present disclosure. No determination has been made, and no assertion is made, as to whether any of the above might be applicable as prior art with regard to the present disclosure.

SUMMARY

An electronic device such as a portable terminal and an electronic device protective cover, for example, a flip type cover, may include at least one cover according to an in-use environment of the electronic device and/or an in-use form by a user such that the cover may be detachably attached to a body of the electronic device to be replaced. For example, the cover may be a rear cover form covering only a rear surface of the body or a flip type form covering both a display unit provided on a front surface of the body and a rear surface of the body, so that a cover, in a form desired by the user, may be replaced in consideration of an in-use environment of the electronic device or a design of the electronic device.

As described above, various gaps may be generated in the electronic device due to a need for coupling of components or connection parts with external devices. The gaps of the electronic devices may cause various water submersion paths on the electronic device. That is, when moisture is introduced through the gaps generated in the electronic device due to a need for coupling of components or connection parts with external devices, electrical terminals and spaces for attaching a battery may be exposed to the moisture that may damage an internal circuit of the electronic device.

That is, because the battery cover for mounting and covering a battery is engaged with the body of the electronic device, a gap may be generated between the battery cover and the body. The electronic device is vulnerable to various water submersion situations due to various gaps generated between the electronic device and the battery cover.

In addition, electronic components such as a Near Field Communication (NFC) antenna, a wireless charging module and a solar charging module are mounted to a battery cover of a recent electronic device to act as electronic components separately from the body of the electronic device. In the battery cover provided with the electronic components, the electronic components may be attached to the inner surface of the cover directly and/or while a separate member is coupled thereto. In this case, when moisture is introduced into a gap between the electronic device and the battery cover, the electronic components may be damaged.

Aspects of the present disclosure are to address at least the above-mentioned problems and/or disadvantages and to provide at least the advantages described below. Accordingly, an aspect of the present disclosure is to provide an electronic device through which a gap between a body and a cover of the electronic device is sealed such that introduction of moisture can be prevented, and an electronic device protective cover.

Another aspect of the present disclosure is to provide an electronic device through which various electronic components can be mounted to the cover such that introduction of moisture into a mounting space for the electronic components can be prevented, and an electronic device protective cover.

In accordance with an aspect of the present disclosure, an electronic device is provided. The electronic device includes a body configured to house the electronic device and including a space for accommodating a battery on one surface of the body, and a cover configured to cover at least the space and being detachably attached to the body, wherein the cover includes a first sealing member located between the one surface of the body and an inner surface of the cover and formed to surround the space.

In accordance with another aspect of the present disclosure, an electronic device is provided. The electronic device includes a body having a space configured to accommodate a battery on one surface of the body, a cover assembly configured to cover at least the space and to detachably attach to the body, the cover assembly including an outer cover and an inner cover stacked on and coupled to an inside of the outer cover, a first sealing member configured to surround the space, the first sealing member being provided in the cover assembly and located between the body and the cover, and an auxiliary coupling unit provided along a circumference of an end of the cover assembly and between the first sealing member and the space.

In accordance with another aspect of the present disclosure, a protective cover for a portable communication device is provided. The protective cover includes a first cover configured to cover a first surface of the portable communication device, and a second cover connected to the first cover and provided on a second surface of the portable communication device, the second cover being configured to cover a battery accommodating space of the portable communication device when the protective cover is coupled to the portable communication device, wherein the second cover includes a first sealing member formed to surround the battery accommodating space.

According to various embodiments of the present disclosure, introduction of moisture into a battery mounting space may be prevented by sealing a gap between a body and a cover of an electronic device.

In addition, various electronic components can be mounted to a cover, and introduction of moisture may be prevented by sealing an electronic device mounting space to which the electronic components are mounted.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
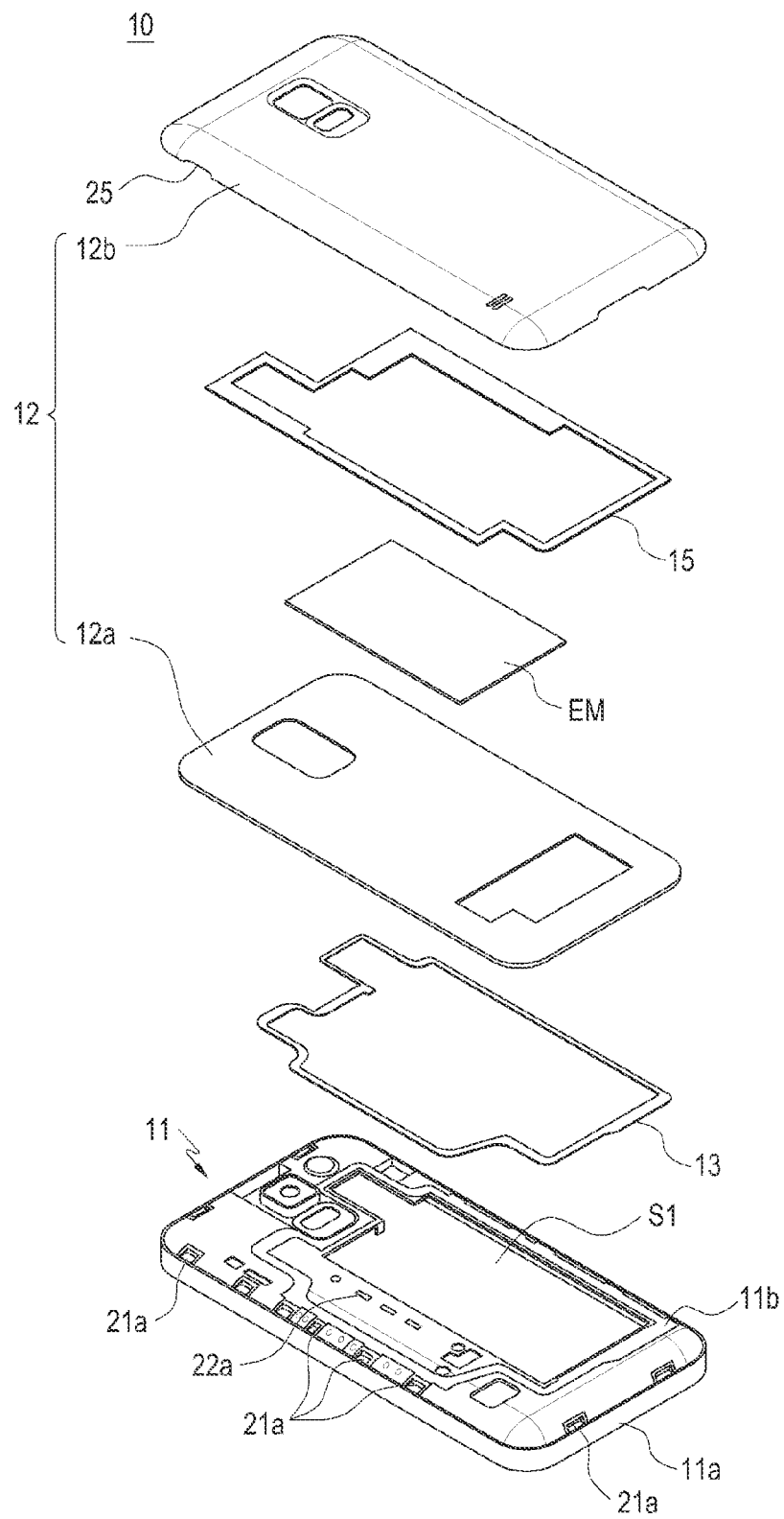
FIG. 1 is an exploded perspective view schematically showing an electronic device according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Although the terms including an ordinal number such as first, second, etc. can be used for describing various elements, the structural elements are not restricted by the terms. The terms are only used to distinguish one element from another element. For example, without departing from the scope of the present disclosure, a first structural element may be named a second structural element. Similarly, the second structural element also may be named the first structural element. As used herein, the term "and/or" includes any and all combinations of one or more associated items.

The relative terms, such as a front surface, a rear surface, an upper surface, and a lower surface, which are described with reference to the drawings may be replaced by ordinal numbers such as first and second. In the ordinal numbers such as first and second, their order are determined in the mentioned order or arbitrarily and may not be arbitrarily changed if necessary.

The terms used in the present disclosure are for the purpose of describing particular embodiments only and are not intended to limit the present disclosure. In the description, it should be understood that the terms "include" or "have" indicate existence of a feature, a number, a step, an operation, a structural element, parts, or a combination thereof, and do not previously exclude the existences or probability of addition of one or more another features, numeral, steps, operations, structural elements, parts, or combinations thereof.

Unless defined differently, all terms used herein, which include technical terminologies or scientific terminologies, have the same meaning as that understood by a person skilled in the art to which the present disclosure belongs. Such terms as those defined in a generally used dictionary are to be interpreted to have the meanings equal to the contextual meanings in the relevant field of art, and are not to be interpreted to have ideal or excessively formal meanings unless clearly defined in the present specification.

In the present disclosure, an electronic device may refer to a terminal, a portable terminal, a mobile terminal, a communication terminal, a portable communication terminal, a portable mobile terminal, a display device, and the like.

For example, the electronic device may be a smartphone, a portable phone, a game player, a Television (TV), a display unit, a heads-up display unit for a vehicle, a notebook computer, a laptop computer, a tablet Personal Computer (PC), a Personal Media Player (PMP), a Personal Digital Assistant (PDA), and the like. The electronic device may be implemented as a portable communication terminal which has a wireless communication function and a pocket size. Further, the electronic device may be a flexible device or a flexible display unit.

Figure 2:
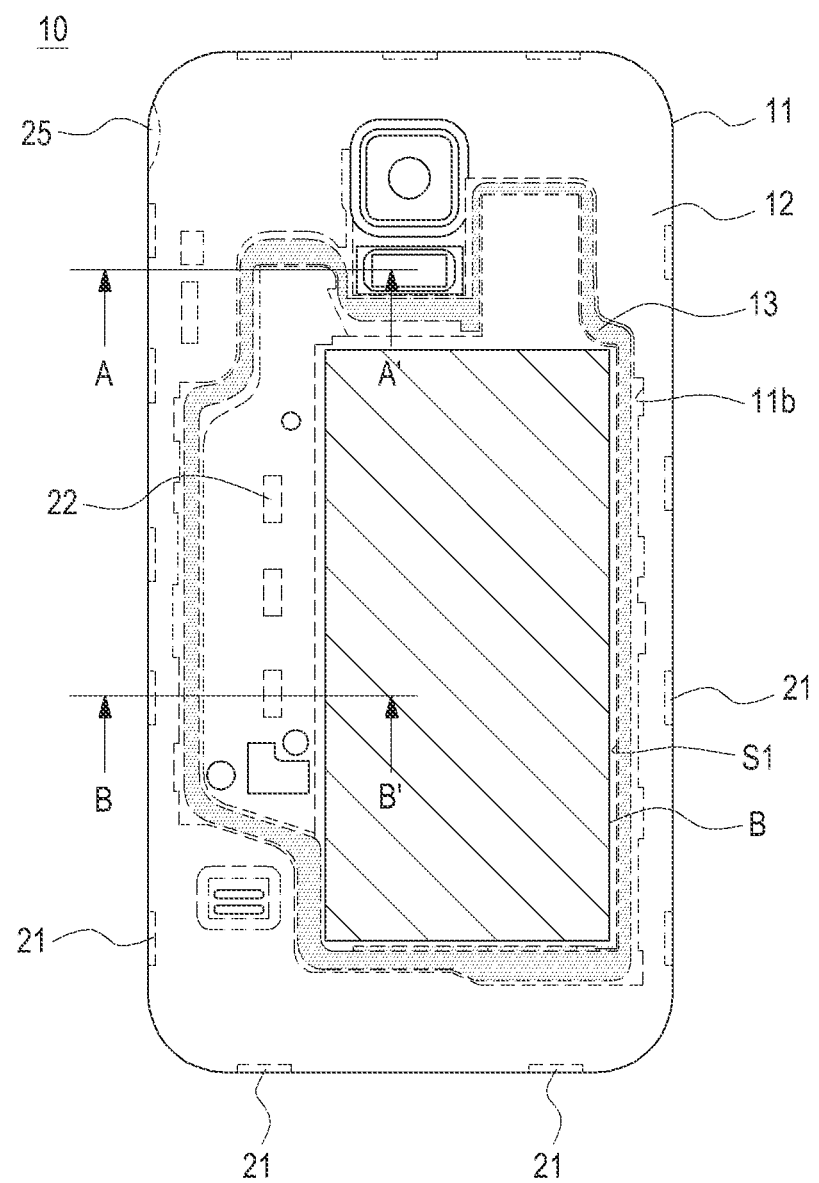
FIG. 2 is a view showing a state in which an electronic device is coupled according to an embodiment of the present disclosure.

FIG. 1 is an exploded perspective view schematically showing an electronic device according to an embodiment of the present disclosure. FIG. 2 is a view showing a state in which an electronic device is coupled according to an embodiment of the present disclosure.

Referring to FIGS. 1 and 2, an electronic device 10, according to an embodiment of the present disclosure, may include a body 11, a cover 12, a first sealing member 13 for sealing a space between the body and the cover, and a second sealing member 15 for sealing the cover in which two configurations are stacked. In detail, the electronic device 10 may include the body 11 including a rear case 11a and a sealing surface 11b, the cover 12, in which an inner cover 12b and an outer cover 12a are stacked to be coupled to each other, and which includes a finger extraction recess 25 formed at a portion of an end of the outer cover 12a, the first sealing member 13 coupled to an inner surface of the inner cover 12b of the cover 12, an electronic module EM provided between the outer cover 12a and inner cover 12b that are stacked and coupled to each other, and a second sealing member 15 for sealing a space between the outer cover 12a and the inner cover 12b that are stacked and coupled to each other.

As discussed above, the body 11 may be configured as a smartphone, a mobile phone, a navigation device, a gaming device, a TV, a vehicular head unit, a notebook computer, a laptop computer, a tablet computer, a PMP, a PDA, and any other similar and/or suitable device configuration. A screen may be viewed from a front surface of the body 11, and a display unit (not shown), through which an input is realized, may be provided. The rear case 11a is coupled to a rear surface of the body 11 to cover internal components of the body 11. The rear case 11a may include a battery mounting space 51, hereinafter, referred to as a space 51, such that the space 51 accommodates a battery B. The body 11 may also include a coupling unit 21 (see FIG. 2) that includes coupling recesses 21a and an auxiliary coupling unit 22 including second fastening parts 22a.

Figure 3:
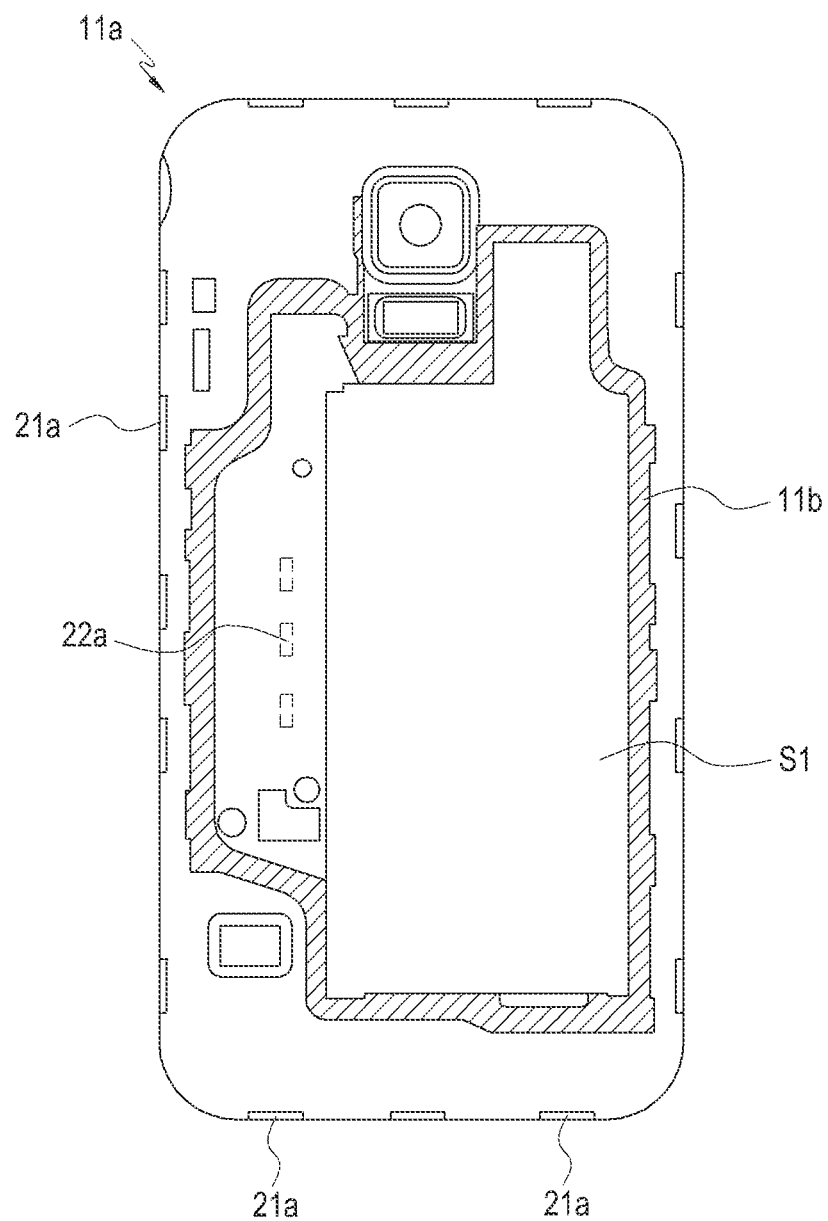
FIG. 3 is a view schematically showing a rear case of an electronic device according to an embodiment of the present disclosure.

FIG. 3 is a view schematically showing a rear case of an electronic device according to an embodiment of the present disclosure.

Referring to FIG. 3, the sealing surface 11b to which the first sealing member 13 is attached is provided on one surface of the rear case 11a. The sealing surface 11b is provided at a peripheral circumference of the space S1 and may be formed in a closed curve shape according to the peripheral circumference of the space S1. If the cover 12 is coupled to the rear case 11a on a rear surface of the body 11, the first sealing member 13 is attached to the sealing surface 11b to seal a gap between the body 11 and the cover 12, preventing introduction of moisture or foreign substances into the gap.

Figure 10:
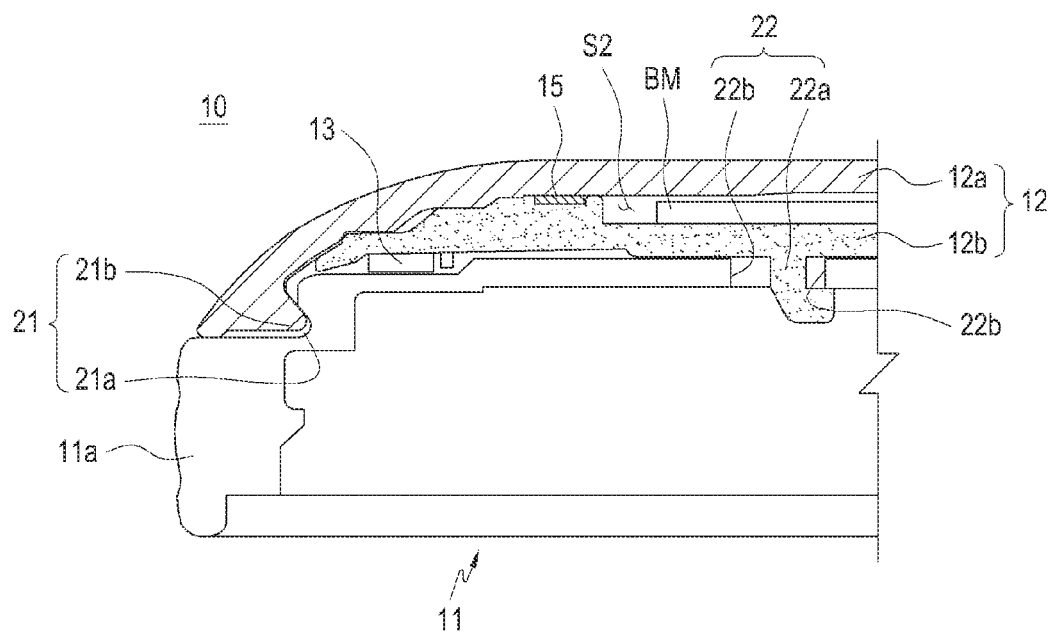
FIG. 10 is a view showing a section taken along line B-B' of FIG. 2 according to an embodiment of the present disclosure.

The coupling unit 21 may be provided along a peripheral circumference of the rear case 11a and along a circumference of an end of the cover 12 of the present disclosure, such that the cover 12 may be coupled to a rear surface of the body 11 (see FIGS. 2 and 10). According to an embodiment of the present disclosure, the coupling unit 21 includes the coupling recesses 21a provided along a peripheral circumference of the rear case 11a, and coupling bosses 21b (see FIGS. 4 and 5) provided along a circumference of an end of the cover 11b to be engaged with or released from the coupling recesses 21a. In detail, the coupling recesses 21a may be formed at a peripheral circumference of the rear case 11a, and the coupling bosses 21b, which may be hook shaped, engaged with the coupling recesses 21a may be formed along an end of the cover 12. Accordingly, the cover 12 may be attached to or detached from the rear case 11b as the coupling bosses 21b is engaged with or released from the coupling recesses 21a. However, a configuration of the coupling unit 21 is not limited thereto. The shape or configuration of the coupling unit 21 may be arbitrarily modified and changed as long as the cover 12 may be coupled while covering a rear surface of the body.

The second fastening parts 22a, which may also be referred to as recessed parts 22a, of the auxiliary coupling unit 22 may be formed between the space S1 of the rear case 11a and the sealing surface 11b of the present disclosure. The recessed parts 22a are configured such that first fastening parts 22b, which may also be referred to as catching parts 22b, of the auxiliary coupling unit 22 are caught by or released from the recessed parts 22a, and the first fastening parts 22b are formed in the cover 12. That is, as the catching parts 22b are caught by or released from the recessed parts 22a, the cover 12 may be further attached and coupled to the rear case 11a. Detailed contents of the auxiliary coupling unit 22 will be described below.

Figure 4:
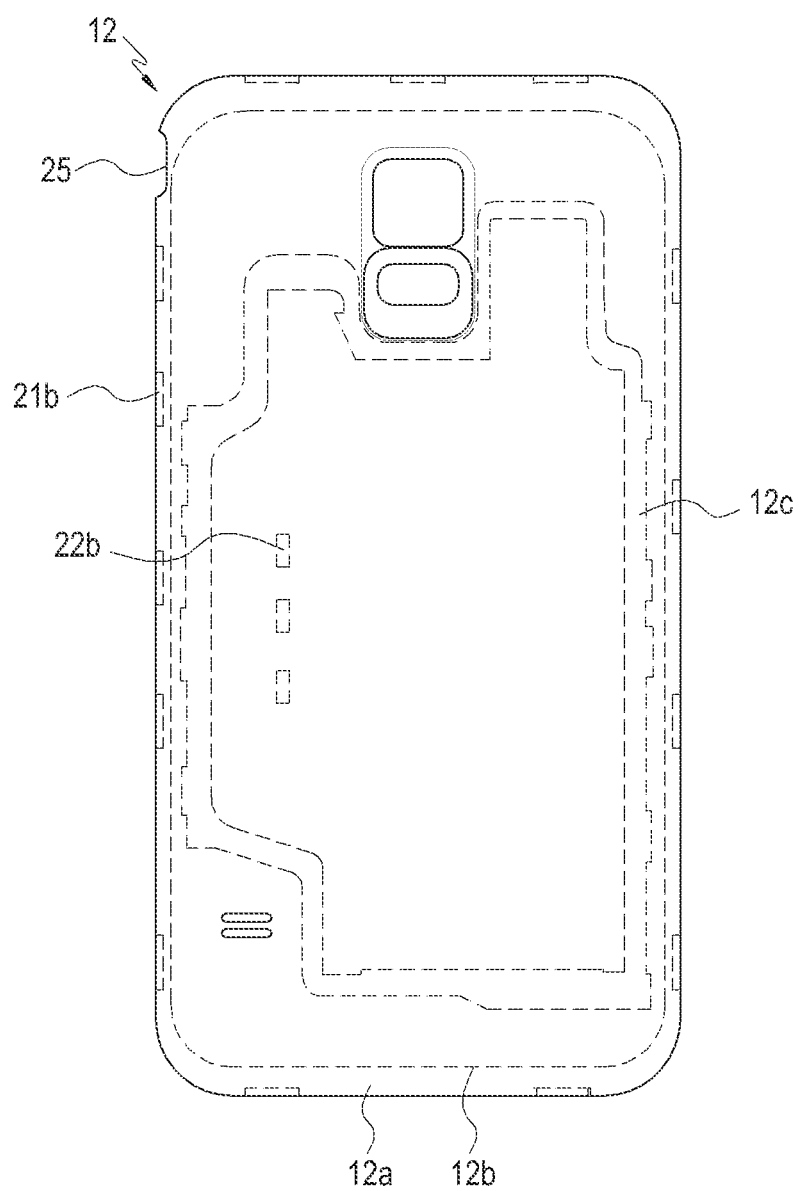
FIG. 4 is a view showing an outer side of a cover according to an embodiment of the present disclosure.
Figure 5:
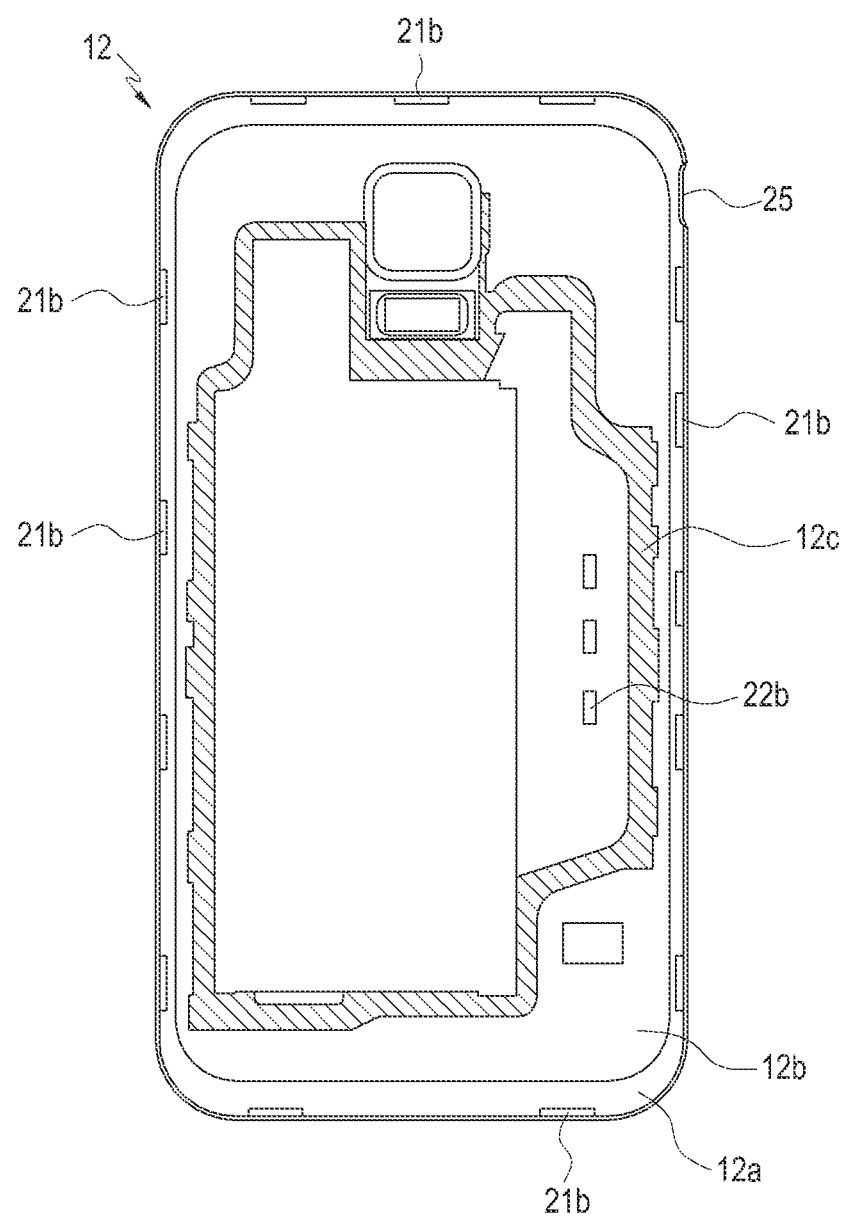
FIG. 5 is a view showing an inner side of a cover according to an embodiment of the present disclosure.

FIG. 4 is a view showing an outer side of a cover according to an embodiment of the present disclosure. FIG. 5 is a view showing an inner side of a cover according to an embodiment of the present disclosure.

Referring to FIGS. 4 and 5, the cover 12 covers a rear surface of the body 11, and may be attached or detached from the rear case 11a. The cover 12, according to an embodiment of the present disclosure, may include a form which covers only a rear surface of the body 11, and may also include a form (not shown) which is coupled to a rear surface of the body 11 to cover a front surface of the body 11 as well as a rear surface of the body 11. Although not shown, when the cover is a flip type cover, hereinafter, referred to as a flip cover, a structure of the cover may include, for example, a first cover such as a front cover and a second cover such as a rear cover. The first cover may be rotatably connected to one side of the second cover, and may cover a display unit provided on a first surface of the body 11. The second cover may be connected to the front cover, may be coupled to a second surface, such as the rear case 11a, and may cover a rear surface of the electronic device 10 including the space 51 for accommodating the battery B. As will be described below, the cover 12, according to an embodiment of the present disclosure, has a structure in which the inner cover 12b and the outer cover 12a are coupled to each other, and the second cover of the flip cover also may have a structure in which the inner cover 12b and the outer cover 12a are coupled to each other. The first sealing member 13 provided inside the cover 12 may be provided on an inner side of the second cover of the flip cover (not shown). The second cover of the flip cover may be generally referred to as 'a cover'.

According to an embodiment of the present disclosure, the cover 12 may also be referred to as a cover assembly 12 in which the inner cover 12b and the outer cover 12a are coupled to each other. In detail, the cover 12, according to an embodiment of the present disclosure, may correspond to one of the cover 12 in which two members, that is, the inner cover 12b and the outer cover 12a are stacked to be coupled to each other so as to form the one of the cover 12 (see FIG. 1 together with FIGS. 7, 8, and 9). If the outer cover 12a and the inner cover 12b are stacked to be coupled to each other, an inner space 51 in which at least one of the electronic modules EM, such as a Near Field Communication (NFC) antenna, a wireless recharger, a solar recharger, an antenna unit, a communication module, a processor, an NFC component, a battery, a Radio Frequency Identification (RFID) unit, a heat emission component, a sensor, a display, a camera, a flash, an electrical button, an acoustic unit, an electrical connector, and any other similar and/or suitable electronic module, may be mounted to be formed and/or disposed therebetween (see FIG. 1 together with FIGS. 7, 8, and 9). Because the cover 12, according to an embodiment of the present disclosure, corresponds to the cover assembly 12, the electronic module EM provided in the inner space S2, as and/or while the inner cover 12b and the outer cover 12a are attached to and detached from each other, may be replaced by an electronic module EM having another function if necessary, and may be replaced as the electronic module EM provided in the inner space 51 malfunctions and/or is damaged. In other words, in a case where the inner cover 12b and the outer cover 12a are detached from each other, at least one of the electronic module EM may be replaced before the inner cover 12b and the outer cover 12a are attached to each other.

According to an embodiment of the present disclosure, the cover assembly 12 may be assembled in a bonded form through a bonding member located between the inner cover 12b and the outer cover 12a. However, the bonded form of the cover assembly 12 is not limited to the bonding member, and may be assembled through an adhesive, thermal fusion, ultrasonic fusion, a catching member, thermal pressing, and through any similar and/or suitable element for bonding and/or method of bonding. The inner cover 12b may be manufactured of a plastic material, such as Polycarbonate (PC), Polyphthalamide (PPA), Polyamide (PA), and Acrylonitrile Butadiene Styrene (ABS), may be manufactured of a complex material including a carbon fiber or a glass fiber, and may be manufactured of a metallic material such as Steel Use Stainless (SUS), aluminum, zinc, or magnesium. The inner cover 12b may be manufactured of a tape or a sheet.

The cover 12 may include a coupling boss 22b which is to be coupled to the rear case 11a, the first sealing member 13 for sealing a gap between the body 11 and the cover 12, a second sealing member 15 (see FIG. 7) for sealing a gap between the inner cover 12b and the outer cover 12a, and the electronic module EM separately provided from the body 11.

As described above, the cover 12 has a configuration in which the inner cover 12b and the outer cover 12a are coupled to each other. The inner cover 12b is stacked on an inner surface of the outer cover 12a, and an inner space S2 (see FIG. 9) in which the electronic module EM may be formed between an outer surface of the inner cover 12b and an inner surface of the outer cover 12a (see FIG. 1 together with FIGS. 7, 8, and 9). An end of the inner cover 12b is located on the inner side of an end of the outer cover 12a. Accordingly, only an outer surface of the outer cover 12a is exposed to the outer surface of the cover 12, and an inner surface of the inner cover 12b is exposed to the inner surface of the cover 12 and an inner surface of the outer cover 12a is viewed along a circumference of an end of the inner cover 12b.

The coupling bosses 21b of the coupling unit 21 may be formed adjacent to each other along a circumference of an end of the inner surface of the outer cover 12a. The finger extraction recess 25 may be formed at a portion of an end of the outer cover 12a so that the cover 12 may be separated from the rear case 11a. According to an embodiment of the present disclosure, the finger extraction recess 25 is provided at an upper corner of the outer cover 12a. If the finger extraction recess 25 formed at the upper corner of the outer cover 12a is raised while the cover 12 is coupled to the rear case 11a, the cover 12 may be separated from the rear case 11a while the coupling bosses 21b, which are caught by the coupling recesses 21a, are separated.

A mounting surface 12c, upon which the first sealing member 13 is mounted, is formed on an inner surface of the inner cover 12b. The mounting surface 12c may be formed similar to the sealing surface 11b, and the mounting surface 12c also forms a closed curve similar to the sealing surface 11b. The mounting surface 12c may be formed to be recessed from an inner surface of the inner cover 12b. In an embodiment of the present disclosure, wherein the mounting surface 12c is recessed from the inner surface of the inner cover 12b, an increase of an overall thickness of the electronic device 10 can be prevented.

Figure 6:
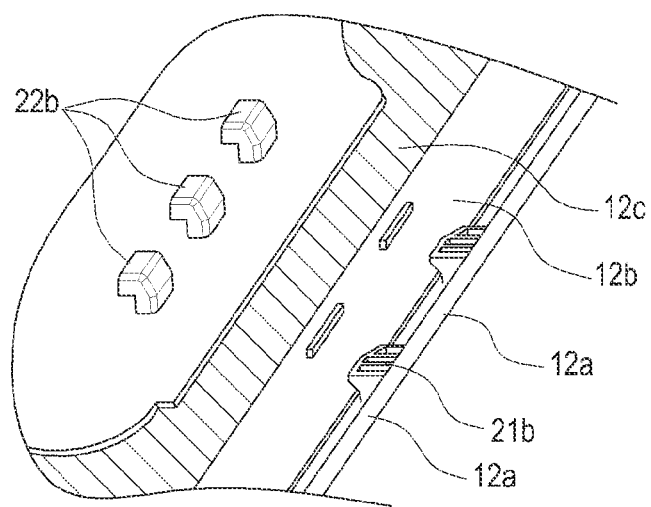
FIG. 6 is a view showing a catching hook formed on an inner surface of an inner cover according to an embodiment of the present disclosure.

FIG. 6 is a view showing a catching hook formed on an inner surface of an inner cover according to an embodiment of the present disclosure.

Referring to FIG. 6, the catching part 22b of the auxiliary coupling unit 22 may be formed in the inner cover 12b. At least one of the catching part 22b is located on the inner surface of the inner cover 12b, and is located on the inner side of the mounting surface 12c. At least one of the catching part 22b is provided to be opposite to the locations of the recessed parts 22a, and are provided to be positioned in the recessed parts 22a. According to an embodiment of the present disclosure, the catching part 22b may correspond to catching hooks. The catching hooks may be formed to be bent in a direction along which the cover 12 is separated. In further detail, the catching hooks may be bent from one side to an opposite side of the cover 12 having the finger extraction recess 25. In this way, as the catching hook is bent in the separation direction of the cover 12, the cover 12 may be coupled to and engaged with the rear case 11a, and when the cover 12 is separated from the rear case 11a through the finger extraction recess 25, it may be easily separated from the recessed parts 22a. However, with respect to the catching parts 22b corresponding to catching hooks, the shapes of the catching parts 22b are not limited thereto, and may correspond to catching balls, which will be described below. When the catching parts 22b correspond to catching balls, the catching balls may be formed of a resilient material. If the catching balls are introduced into the recessed parts 22a, they may be coupled to the recessed parts 22a while the shapes of the catching balls resiliently vary. If the cover 12 is separated from the rear case 11a, it may be separated from the recessed parts 22a while the shapes of the catching balls resiliently vary (see FIG. 11). The configuration of the auxiliary coupling unit 22 including the catching parts 22b and the recessed parts 22a will be described in detail below.

Figure 7:
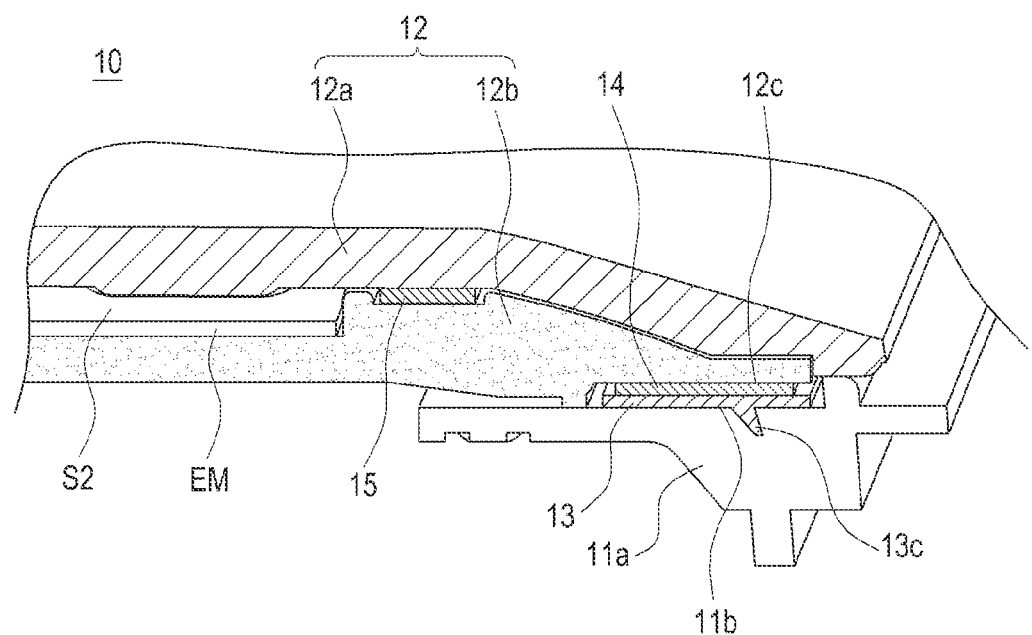
FIG. 7 is a view showing a section taken along line A-A' of FIG. 2 according to an embodiment of the present disclosure.

FIG. 7 is a view showing a section taken along line A-A' of FIG. 2 according to an embodiment of the present disclosure.

Figure 8:
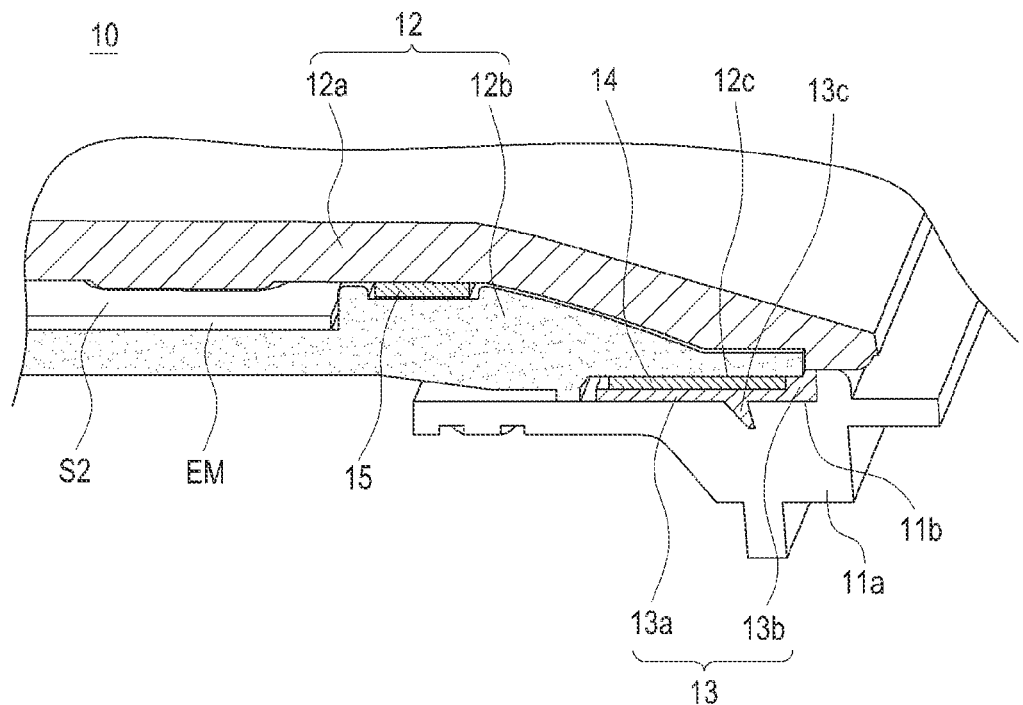
FIG. 8 is a view showing a section taken along line A-A' of FIG. 2 and is a view showing another embodiment of a first sealing member a according to an embodiment of the present disclosure.

Referring to FIG. 7, the first sealing member 13, according to an embodiment of the present disclosure, may be provided primarily to seal a gap between the rear case 11a and the cover 12, and also may be provided to seal a gap between the inner cover 12b and the outer cover 12a (see FIG. 8). The first sealing member 13 may be formed along an inner surface of the cover 12 while forming a closed curve (see FIG. 1 and FIG. 7). An inner space S2 and a coupling member 14 are also illustrated in FIG. 7.

In detail, the first sealing member 13 is coupled to the mounting surface 12c formed on an inner surface of the inner cover 12b of the cover 12 to be recessed. The first sealing member 13 coupled to the mounting surface 12c may be formed to have a height from the inner surface of the inner cover. Accordingly, if the cover 12 is coupled to the rear case 11a, the first sealing member 13 may be provided to be attached to the sealing surface 11b of the above-described rear case 11a. A thin film type auxiliary sealing part 13c extending from the first sealing member 13 may be further provided on a rear surface of the first sealing member 13. The thin film type auxiliary sealing part 13c may be located between the sealing surface 11b and the first sealing member 13. When a gap is generated between the sealing surface 11b and the first sealing member 13 due to the first sealing member 13 coming off after the cover 12 is coupled to the rear case 11a, the auxiliary sealing unit 13c can block the gap to further prevent the space from being submerged. The first sealing member 13 is attached along a circumference of the space S1, and seals a submersion path between the cover 12 and the rear case 11a, in more detail, a path through which the space 51 is submerged.

Figure 9:
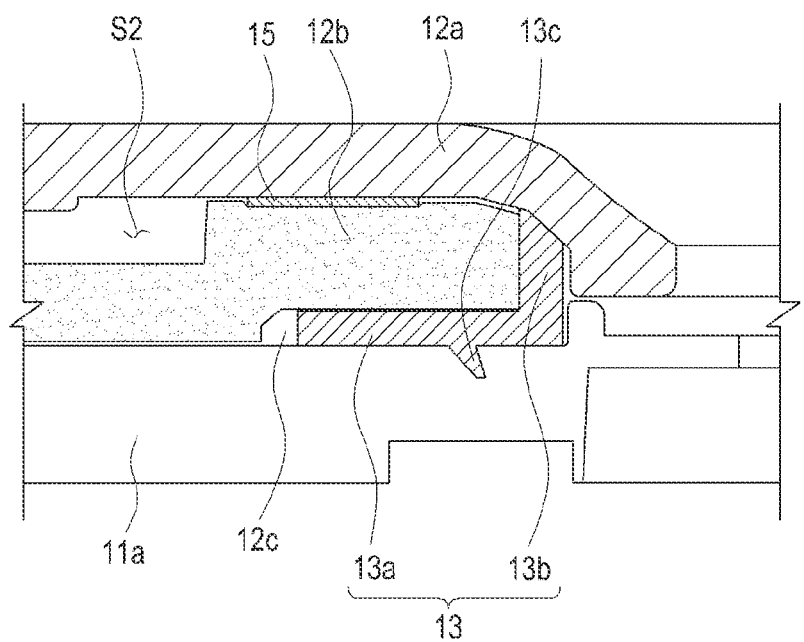
FIG. 9 is a view showing a section taken along line A-A' of FIG. 2 and is a view showing another embodiment of a first sealing member according to an embodiment of the present disclosure.

FIGS. 8 and 9 are views showing a section taken along line A-A' of FIG. 2 and are views showing another embodiment of a first sealing member according to various embodiments of the present disclosure.

Referring to FIGS. 8 and 9, the first sealing member 13, according to an embodiment of the present disclosure, may include a first sealing part 13a and a second sealing part 13b. The first sealing part 13a may be mounted to the mounting surface 12c to cover a gap between the body 11 and the cover 12. The second sealing part 13b may extend from the first sealing part 13a to seal a gap generated between an end of the inner cover 12b and an inner surface of the outer cover 12a while the inner cover 12b and the outer cover 12a are coupled to each other.

As discussed above, the first sealing member 13, according to the embodiment of the present disclosure illustrated in FIG. 7, does not include the first sealing part 13a. In contrast, the first sealing member 13, according to the embodiment of the present disclosure illustrated in FIGS. 8 and 9, is provided with both the first sealing part 13a and the second sealing part 13b extending from the first sealing part 13a.

Accordingly, the first sealing member 13 including only the first sealing part 13a may seal a gap between the cover 12 and the body 11. Furthermore, the first sealing member 13 including the first sealing part 13a and the second sealing part 13b may seal a gap between the cover 12 and the body 11 and also seal a gap between the inner cover 12b and the outer cover 12a.

The first sealing member 13 discussed in the above described embodiments of the present disclosure includes a closed curve-shaped resilient material, and protrudes toward the sealing surface 11b while being coupled to the mounting surface 12c. If the cover 12 is engaged with a rear surface of the body 11 to cover the rear case 11a, the first sealing member 13 of a resilient material is pressed by and attached to the sealing surface 11b so that a submersion path, that is, a gap between the rear case 11a and the cover 12 or a gap between the inner cover 12b and the outer cover 12a, may be blocked.

The first sealing member 13 may be coupled to the mounting surface 12c by the coupling member 14. According to an embodiment of the present disclosure, the coupling member 14 includes a double-sided tape. However, a configuration of the coupling member 14 is not limited to the double-sided tape. For example, as the first sealing member 13 of a resilient material may be dually injection-molded into the mounting surface 12c of the cover 12, the first sealing member 13 may be coupled to the mounting surface 12c, however, a configuration of coupling the first sealing member 13 to the mounting surface 12c may be arbitrarily modified or changed. For example, the first sealing member 13 of a resilient material may be attached and coupled to the mounting surface 12c through a high temperature and/or a high pressure operation.

The second sealing member 15 may seal the inner space S2 between the outer cover 12a and the inner cover 12b. In detail, the cover 12, according to an embodiment of the present disclosure, has a structure of a cover assembly 12 in which the inner cover 12b and the outer cover 12a are stacked so as to be coupled to each other while being attached to each other, such that the cover 12 may include the electronic module EM having a function separately from the body 11. Accordingly, when the inner cover 12b and the outer cover 12a are stacked so as to be coupled, a gap may be generated between the inner cover 12b and the outer cover 12a and moisture and/or foreign substances may be introduced into the inner space S2 through the gap. The second sealing member 15 is provided between the inner cover 12b and the outer cover 12a along a circumference of the inner space S2 to seal the inner space S2 from the outside. The second sealing member 15, according to an embodiment of the present disclosure, may include at least one of an adhesive, a waterproof tape, and a rubber member to seal a gap between the inner cover 12b and the outer cover 12a after the inner cover 12b and the outer cover 12a are coupled to each other.

FIG. 10 is a view showing a section taken along line B-B' of FIG. 2 according to an embodiment of the present disclosure.

Referring to FIG. 10, the auxiliary coupling unit 22 may be provided on the inner surface of the inner cover 12b and the rear case 11a. A battery module BM may be disposed between the inner cover 12b and the outer cover 12a in the space S2. The auxiliary coupling unit 22 couples a portion of the cover 12, which becomes farther from the body 11, to the rear case 11a through the first sealing member 13. In detail, if the cover 12 is coupled to a rear surface of the rear case 11a then the first sealing member 13 is attached to the sealing surface 11b, however, a force that pushes the cover 12 in an opposite direction of the body 11 is applied to the cover 12 while the first sealing member 13 is attached to the sealing surface 11b. Accordingly, portions of the cover 12, other than the peripheral circumference of an end of the cover 12, coupled to the rear case 11a may fail to maintain their original shapes and are deformed in a direction in which the portions of the cover 12 become farther away from the rear case 11a. Accordingly, the auxiliary coupling unit 22 may prevent the cover 12 from being deformed in a direction in which the cover 12 becomes farther away from one surface of the rear case 11a through a resilient force of the first sealing member 13 to make a coupling force firmer.

The auxiliary coupling unit 22 may be provided in a direction in which the cover 12 is separated from the body 11. In detail, as a force is applied to the cover 12, according to the present disclosure, from one side to an opposite side of the body 11, the cover 12 is bent from one side to an opposite side and the coupling bosses 21b are separated from the coupling recesses 21a. Accordingly, the cover 12 may be coupled to or released from the body 11 in the separation direction of the cover 12 such that the auxiliary coupling unit 22 is separated along the releasing direction when the cover 12 is separated from the body 11 while being bent from one side to an opposite side of the body 11.

As described above, the auxiliary coupling unit 22 may include the recessed parts 22a and the catching parts 22b.

The recessed parts 22a may be formed between the space S1 of the rear case 11a and the sealing surface 11b. The catching parts 22b protruding from an inner surface of the inner cover 12, for example, the hooks (see FIG. 10) or the catching balls (see FIG. 11), may be caught by or released from the recessed parts 22a. That is, as the catching parts 22b are caught by and fixed to the recessed parts 22a, the cover 12 may be further attached and coupled to the rear case 11a.

The catching parts 22b, according to an embodiment of the present disclosure, may be catching hooks protruding from the inner side of the inner cover 12b toward the recessed parts 22a. As discussed above, the catching hooks are located on the inner surface of the inner cover 11b, and are located on the inner side of the mounting surface 12c. The catching hooks 22b are provided to be opposite to the locations of the recessed parts 22a and are provided to be positioned in the recessed parts 22a. The catching hooks may be formed to be bent in a direction along which the cover 12 is separated. In detail, the catching hooks may be bent from one side to an opposite side of the cover 12 having the finger extraction recess 25. That is, if a user raises the cover 12 using the finger extraction recess 25 while the cover 12 is coupled to the rear case 11a, a force is applied from one side of the body 11 to an opposite side of the body 11, and the cover 12 is bent from one side of the body 11 to an opposite side of the body 11. As the catching hooks are bent in the separation direction of the cover 12, they may be separated while being spaced apart from the recessed parts 22a in a direction in which the cover 12 is bent when the cover 12 is separated from the rear case 11a while being coupled to the rear case 11a.

Figure 11:
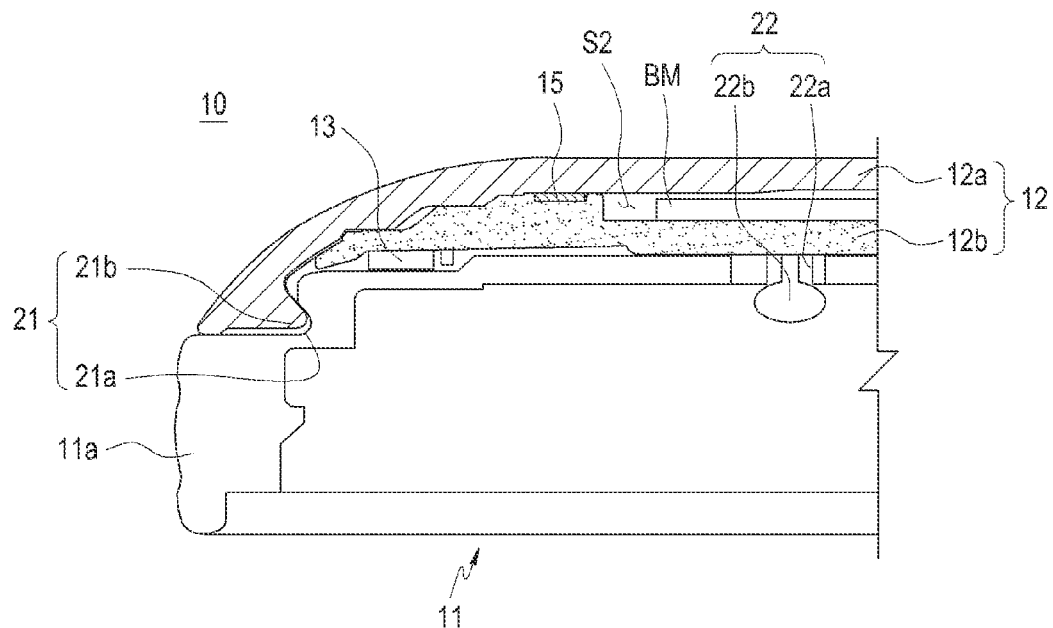
FIG. 11 is a view showing a section taken along line B-B' of FIG. 2, and is a view showing another embodiment of a catching part according to an embodiment of the present disclosure.

FIG. 11 is a view showing a section taken along line B-B' of FIG. 2, and is a view showing another embodiment of a catching part according to an embodiment of the present disclosure.

Referring to FIG. 11, the electronic device according to an embodiment of the present disclosure has the substantially same configuration as the above-described configuration, but the shapes of catching parts thereof are different. In a description of an embodiment of the present disclosure, the description of the configuration of the above-described embodiment will be applied to the present embodiment.

According to an embodiment of the present disclosure, the catching parts 22b may be catching balls. The catching balls protrude toward the recessed parts 22a on the mounting surface 12c, and ends of the catching balls have the shapes of balls. The ends of the ball shapes are larger than the recessed parts 22a, and are sized to be large enough to be inserted into or extracted from the recessed parts 22a. The catching balls may be formed of a resilient material. If the catching balls larger than the recessed parts 22a are introduced into the recessed parts 22a, they may be introduced into and coupled to the recessed parts 22a while the shapes of the catching balls resiliently vary. If the cover 12 is separated from the rear case 11a, it may be separated from the recessed parts 22a while the shapes of the catching balls resiliently vary.

According to an embodiment of the present disclosure, the auxiliary coupling unit 22 includes the catching parts 22b and the recessed parts 22a. In detail, one or more of the catching parts 22b, provided on the inner surface of the cover 12 and configured on the inner side of the first sealing member 13 to couple the cover 12 to the body 12, correspond to the recessed parts 22a. In addition, the recessed parts 22a are provided on one surface of the body 11 to be engaged with the catching parts 22b, the catching parts 22b are detachably disposed on the body, and the catching parts 22b are formed around the space S1 correspond to the recessed parts 22a. However, the auxiliary coupling unit 22, that is, the catching parts 22b and the recessed parts 22a are not limited thereto. That is, the shape and configuration of the auxiliary coupling unit 22 may be variously modified or changed. For example, the first fastening parts may correspond to recessed parts and the second fastening parts may correspond to catching parts.

As discussed above, the electronic device, according to the present disclosure, is provided such that a gap generated through coupling, for example, a gap between the cover and the rear case or a gap between the inner cover and the outer cover of the cover assembly 12 may be sealed, so that introduction of foreign substances into the electronic device through the gap can be prevented.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
 a body configured to house the electronic device and including a space for accommodating a battery on one surface of the body; and
 a cover configured to cover at least the space and being detachably attached to the body,
 wherein the cover comprises:
  a first sealing member located between the one surface of the body and an inner surface of the cover and formed to surround the space,
  an outer cover,
  an inner cover located between the outer cover and the body when the cover is attached to the body, and
  an electronic circuit,
 wherein at least a portion of the electronic circuit is inserted between the outer cover and the inner cover.

2. The electronic device of claim 1, wherein the electronic circuit comprises at least one of a wireless recharger, a solar recharger, an antenna unit, a communication transceiver, a processor, a near field communication (NFC) component, a battery, a radio frequency identification (RFID) component, a heat emission component, a sensor, a display, a camera, a flash, an electrical button, a speaker, a microphone, or an electrical connector.

3. The electronic device of claim 1, further comprising a second sealing member configured to surround the electronic circuit, wherein the second sealing member is located between the outer cover and the inner cover.

4. The electronic device of claim 3, wherein the second sealing member comprises at least one of an adhesive, a waterproof tape, or a rubber member.

5. The electronic device of claim 1, wherein the first sealing member comprises:
a first sealing part configured to cover a gap between the body and the cover; and
a second sealing part extending from the first sealing part and configured to seal a gap between an end of the inner cover and an inner surface of the outer cover.

6. The electronic device of claim 1, further comprising a thin film type auxiliary seal extending from the first sealing member,
wherein the thin film type auxiliary seal is disposed on a rear surface of the first sealing member.

7. The electronic device of claim 1, wherein the first sealing member has a closed curve shape.

8. The electronic device of claim 7,
wherein the first sealing member is disposed on a sealing surface the body, and
wherein the sealing surface is provided at a peripheral circumference of the space and is formed in a closed curve shape based on the peripheral circumference of the space.

9. The electronic device of claim 1, further comprising:
a coupling structure configured to couple the cover to one surface of the body, the coupling structure being provided along a peripheral circumference of the cover and a peripheral circumference of the rear case, and
an auxiliary coupling structure configured to couple the cover to the one surface of the body between the space and the sealing member.

10. The electronic device of claim 9, wherein the auxiliary coupling structure comprises:
at least one first fastening part configured to couple the cover to the body, the at least one first fastening part being provided on an inner surface of the cover and on an inside of the first sealing member; and
at least one second fastening part configured to engage with the first fastening parts on the one surface of the body,
wherein the at least one second fastening part is disposed such that the first fastening parts are detachably fastened to the second fastening parts, and
wherein the at least one second fastening part is formed around the space.

11. The electronic device of claim 10,
wherein the at least one first fastening part is a catching part provided on an inner surface of the cover, and
wherein the at least one second fastening part is a recessed part by which the catching part is caught or from which the catching part is released.

12. The electronic device of claim 11, wherein the catching part is a catching hook which is bent in a direction in which the cover is separated.

13. The electronic device of claim 11, wherein the catching part is a catching ball formed of a resilient material.

14. An electronic device comprising:
a body having a space configured to accommodate a battery on one surface of the body;
a cover assembly configured to cover at least the space and to detachably attach to the body, the cover assembly including an outer cover and an inner cover stacked on and coupled to an inside of the outer cover;
a first sealing member configured to surround the space, the first sealing member being provided in the cover assembly and located between the body and the cover; and
an auxiliary coupling structure provided along a circumference of an end of the cover assembly and between the first sealing member and the space.

15. The electronic device of claim 14, wherein the first sealing member comprises:
a first sealing part configured to cover a gap between the body and the cover assembly; and
a second sealing part extending from the first sealing part and configured to seal a gap between an end of the inner cover and an inner surface of the outer cover.

16. The electronic device of claim 14, further comprising a second sealing member configured to seal the inner space between the outer cover and the inner cover,
wherein the second sealing member comprises at least one of an adhesive, a waterproof tape, or a rubber ring.

17. A protective cover for a portable communication device, the protective cover comprising:
a first cover configured to cover a first surface of the portable communication device; and
a second cover connected to the first cover and provided on a second surface of the portable communication device,
wherein the second cover is configured to cover a battery accommodating space of the portable communication device when the protective cover is coupled to the portable communication device, and
wherein the second cover includes a first sealing member formed to surround the battery accommodating space, the second cover comprising:
an outer cover,
an inner cover provided at an inside of the outer cover and located between the outer cover and the body when the cover is attached to the body, and
an electronic circuit provided between the outer cover and the inner cover.

18. The protective cover of claim 17, wherein the electronic circuit comprises at least one of a wireless recharger, a solar recharger, an antenna unit, a communication module, a processor, a near field communication (NFC) component, a battery, a radio frequency identification (RFID) component, a heat emission component, a sensor, a display, a camera, a flash, an electrical button, a speaker, a microphone, or an electrical connector.

19. The protective cover of claim 17, further comprising a second sealing member located between the outer cover and the inner cover and configured to surround the electronic circuit.

20. The protective cover of claim 19, wherein the second sealing member comprises at least one of an adhesive, a waterproof tape, or a rubber member.

21. The protective cover of claim 17, wherein the first sealing member comprises:
a first sealing part configured to cover a gap between the body and the cover; and
a second sealing part extending from the first sealing part, the second sealing part being configured to seal a gap between an end of the inner cover and an inner surface of the outer cover.

22. The protective cover of claim 17, further comprising a thin film type auxiliary seal extending from the first sealing member and provided on a rear surface of the first sealing member.

23. The protective cover of claim 17, further comprising at least one first fastening part configured to couple the cover to a body of the portable communication device on an inside of the first sealing member when an inner surface of the protective cover is viewed.

24. The protective cover of claim 23, wherein the at least one first fastening part is configured to be detachably fastened to at least one second fastening part formed around the battery accommodating space on one surface of the body.

25. The protective cover of claim 23, wherein the at least one first fastening part is a catching hook bent in a direction in which the cover is separated.

26. The protective cover of claim 23, wherein the at least one first fastening part is a catching ball formed of a resilient material.

* * * * *